United States Patent [19]
Whang et al.

[11] Patent Number: 5,792,561
[45] Date of Patent: Aug. 11, 1998

[54] COLOR DISPLAY DEVICE USING ELECTROLUMINESCENT POLYMER AND METHOD FOR FABRICATING THE SAME

[75] Inventors: Wol-Yon Whang; Jang-Joo Kim, both of Daejeon, Rep. of Korea

[73] Assignee: Electronics and Telecommunications Research Institute, Daejeon, Rep. of Korea

[21] Appl. No.: 690,965

[22] Filed: Aug. 1, 1996

[30]    Foreign Application Priority Data

Dec. 22, 1995 [KR]  Rep. of Korea ............ 95-54536

[51] Int. Cl.$^6$ ............................................. B32B 15/04
[52] U.S. Cl. ....................... 428/457; 257/88; 257/89; 428/209; 428/690; 428/917
[58] Field of Search ............................ 428/457, 690, 428/917, 209; 257/88, 89

[56]           References Cited

U.S. PATENT DOCUMENTS 5,587,589   12/1996   So et al. ............................. 257/40

*Primary Examiner*—John M. Cooney, Jr.
*Attorney, Agent, or Firm*—Antonelli, Terry, Stout & Kraus, LLP

[57]           ABSTRACT

A color display device using an electroluminescent polymer includes: a transparent substrate; a transparent electrode formed on the transparent substrate, the electrode being buried by a luminescent polymer; a photo-bleached region (non-luminous region) of a first luminescent polymer formed on the transparent electrode; a non-photo-bleached region (luminous region) of a first luminescent polymer formed between a portion of the transparent electrode and a first metal electrode; a photo-bleached region (non-luminous region) of a second luminescent polymer formed on the photo-bleached region of the first luminescent polymer; a non-photo-bleached region (luminous region) of a second luminescent polymer formed between a portion of the photo-bleached region of the first luminescent polymer and a second metal electrode; a first metal electrode formed on the non-photo-bleached region of the first luminescent polymer; a photo-bleached region (non-luminous region) of a third luminescent polymer formed on the photo-bleached region of the second luminescent polymer; a non-photo-bleached region (luminous region) of a third luminescent polymer formed between a portion of the photo-bleached region of the second luminescent polymer and a third metal electrode; a second metal electrode formed on the non-photo-bleached region of the second luminescent polymer; and a third metal electrode formed on the non-photo-bleached region of the third luminescent polymer.

4 Claims, 7 Drawing Sheets

COLOR DISPLAY DEVICE USING ELECTROLUMINESCENT POLYMER AND METHOD FOR FABRICATING THE SAME

BACKGROUND OF THE INVENTION

The present invention relates to a color display device using at least two electroluminescent polymer materials which show three primary colors of light or different colors and a method for fabricating the same, more particularly, the present invention relates to a color display device using the electroluminescence in an organic polymer and a method for fabricating the same, in which its non-luminous region is formed by photo-bleaching.

Generally, an electroluminescent device which carries out luminescence using electroluminescence consists of a transparent substrate, a transparent electrode formed on the substrate, an electroluminescent polymer formed on the transparent electrode, and a metal electrode serving as a cathode. Recently, efforts to fabricate the electroluminescent device using an organic polymer have been made in various ways. The electroluminescent device using the organic polymer is easier to fabricate than one using an inorganic material. Also, its production cost is low, and it can make various colors. Particularly, as a wide flat panel display which cannot be fabricated using an inorganic material, as is increasingly required, studies on the electroluminescent device using the organic polymer are rapidly increased. The organic electroluminescent device is an active luminescent device having a low driving voltage. Thus, its color is bright and its response speed is fast, dissimilar to a passive device such as liquid crystal display (LCD). Accordingly, attempts to realize a color display device using the electroluminescent polymer continuously have been made.

Generally, in fabrication of the electroluminescent device using a conjugated polymer or organic dyes, the change of its wavelength depends on the material forming its luminescent layer. That is, light having a desired wavelength can be obtained by finding the luminescence wavelength of the luminescent layer material. In order to fabricate the color display using the electroluminescence in the conjugated polymers showing different colors, or organic dyes, an evaporation or stacked structure formation method can be employed, which is used for fabricating the electroluminescent device using the inorganic material. Also, the color display can be fabricated using a method in which the electroluminescence is carried out using a material which can emit white light, and then a color filter is used to control colors. Otherwise, a method can be employed in which luminescent polymers which respectively emit one of three primary colors are stacked. However, when the stacked structure is employed, light emitted from the upper polymer of the stacked structure maybe absorbed by its lower polymer. Otherwise, light emitted from its upper polymer is mixed with light emitted from its lower polymer, and this mixture of lights may easily emit to the outside. Accordingly, it is difficult to form an appropriate pixel, and to control its color.

SUMMARY OF THE INVENTION

Generally, when an organic conductive polymer is exposed to light in the ultraviolet or visible region, a photo-chemical reaction occurs in a portion exposed to light. By doing so, the portion is photo-bleached. In this photo-bleached portion, luminescence does not occur even if an external electric field is applied to it. Therefore, the photo-bleached region will be a region will be a non-luminous region and the non-photo-bleached region will be luminous region. This luminous region will be a light emitting element in a pixel when applied to the display. The non-photo-bleached region is formed with metal electrode working as a photomask when the device is exposed to the light. The shadowed region by metal electrode is the non-photo-bleached region which is a luminous region.

It is an object of the present invention to provide a color display device using an electroluminescent polymer and a method for fabricating the same, in which conductive polymers emitting different colors (such as red, green or blue) are stacked and a region of each layer of the stacked structure, so as not to show a color, are photo-bleached, to prevent the luminescence in the upper polymer of the stacked structure from being absorbed by its lower polymer, and to prevent an electroluminesence in the lower polymer from being generated, thereby satisfactorily transmitting a color radiated from each polymer of the stacked structure to a transparent substrate.

To accomplish the object of the present invention, there is provided a color display device using an electroluminescent polymer, including: a transparent substrate; a transparent electrode formed on the transparent substrate, the electrode being buried by a luminescent polymer; a photo-bleached region (non-luminous region) of a first luminescent polymer formed on the transparent electrode; a non-photo-bleached region (luminous region) of a first luminescent polymer formed between a portion of the transparent electrode; and a first metal electrode a photo-bleached region (non-luminous region) of a second luminescent polymer formed on the photo-bleached region of the first luminescent polymer; a non-photo-bleached region (luminous region) of a second luminescent polymer formed between a portion of the photo-bleached region of the first luminescent polymer; and a second electrode a first metal electrode formed on the non-photo-bleached region of the first luminescent polymer; a photo-bleached region (non-luminous region) of a third luminescent polymer formed on the photo-bleached region of the second luminescent polymer; a non-photo-bleached region (luminous region) of a third luminescent polymer formed on a portion of the photo-bleached region of the second luminescent polymer; a second metal electrode formed on the non-photo-bleached region of the second luminescent polymer; and a third metal electrode formed on the non-photo-bleached region of the third luminescent polymer.

For the object of the present invention, there is further provided a method for fabricating a color display device using an electroluminescent polymer, including the steps of: depositing a transparent electrode material on a transparent substrate; patterning the material to form a predetermind type of transparent electrode; forming a first luminescent polymer thin film on the transparent electrode, and carrying out heat treatment to harden the thin film; forming a first metal electrode on a portion of the first luminescent polymer thin film, in which a luminous region will be formed, the electrode being formed in the shape of a stripe;irradiating light to the overall surface of the substrate to selectively photo-bleach a portion on which the first metal electrode is not covered using the first metal electrode as a mask, thereby forming a photo-bleached region (non-luminous region) and non-photo-bleached region (luminous region) of the first luminescent polymer thin film; forming a second luminescent polymer thin film on the first luminescent polymer thin film, forming a second metal electrode on a portion of the second luminescent polymer thin film, in which a luminous region will be formed, and irradiating light to the overall surface of the substrate to selectively photo-bleach a portion on which the second metal electrode is not covered using the second metal electrode as a mask, thereby forming a photo-bleached region (non-luminous region) and non-photo-bleached region (luminous region) of the second luminescent polymer thin film, the second electrode being formed in the shape of a stripe; and forming a third luminescent polymer thin film on the second luminescent polymer thin film, forming a third metal electrode on a portion of the third luminescent polymer thin film, in which a luminous region will be formed, and irradiating light to the overall surface of the substrate to selectively photo-bleach a portion on which the third metal electrode is not covered using the third metal electrode as a mask, thereby forming a photo-bleached region (non-luminous region) and non-photo-bleached region (luminous region) of the third luminescent polymer thin film, the third electrode being formed in the shape of a stripe.

The present invention is constructed to realize a color display device by stacking at least two organic polymer electroluminscent materials whose luminescent colors are different from one another, and pattern luminous and non-luminous regions of the stacked polymer through photo-bleaching. According to the present invention, at least two luminescent materials whose band gaps are known are sequentially spin coated or evaporated on a transparent substrate on which a transparent electrode is thinly covered to form a thin film, thereby forming a stacked structure. Here, the non-luminous region is formed on a portion on which the electrode is not covered in each layer of the stacked structure through photo-bleaching.

BRIEF DESCRIPTION OF THE ATTACHED DRAWINGS

The novel features of the invention, as well as other features and advantages thereof, will best be understood by reference to the following detailed description of a particular embodiment, read in conjunction with the accompanying drawings, wherein.

DETAILED DESCRIPTION OF PREFERRED EMBODIMENT

Figure 1A:
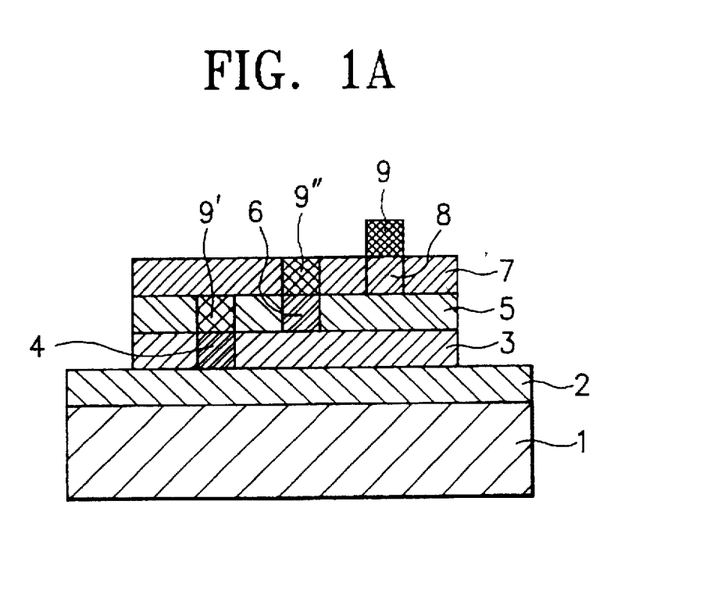
FIGS. 1A and 1B are a cross-sectional view and plane view of a stacked structure of a color display device according to an embodiment of the present invention, respectively.
Figure 1B:
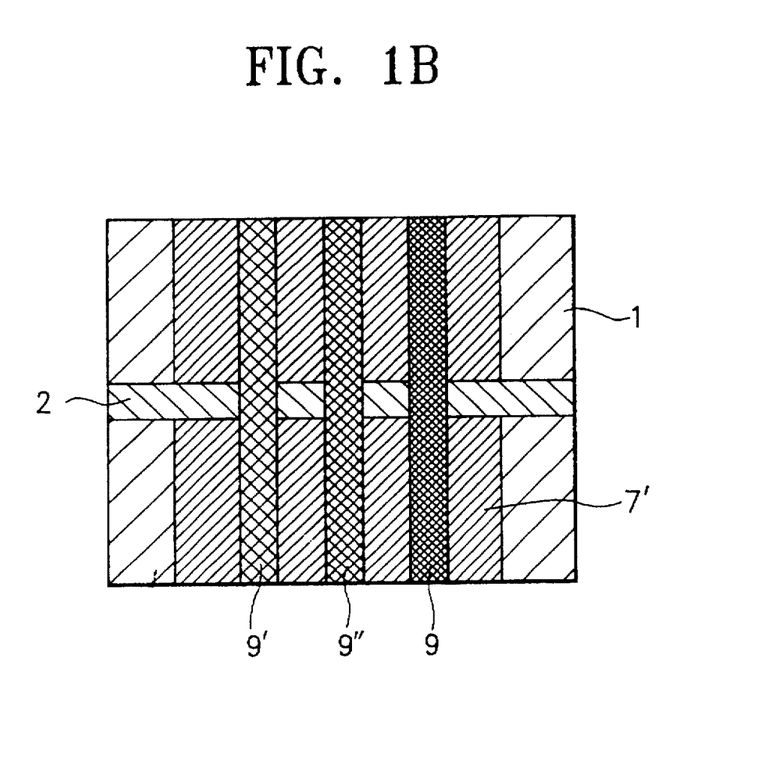

A preferred embodiment of the present invention will be explained below with reference to the accompanying drawings. FIG. 1A is cross-sectional view of a stacked structure of a polymer for realizing a color display device according to an embodiment of the present invention, and FIG. 1B is a plan view of FIG. 1A. As shown in FIGS. 1A and 1B, the color display device according to the present invention consists of a transparent substrate 1, a transparent electrode 2 formed on transparent substrate 1 and patterned to be buried by a luminescent polymer, a photo-bleached region (non-luminous region) 3 of a first luminescent polymer formed on transparent electrode 2, a non-photo-bleached region (luminous region) 4 of the first luminescent polymer formed between a portion of transparent electrode 2 and a first metal electrode 9, a photo-bleached region (non-luminous region) 5 of a second luminescent polymer formed on photo-bleached region 3 of the first luminescent polymer, a non-photo-bleached region (luminous region) 6 of the second luminescent polymer formed between a portion of photo-bleached region 3 of the first luminescent polymer and a second metal electrode 9 the a first metal electrode 9' patterned on non-photo-bleached region 4 of the first luminescent polymer, a photo-bleached region (non-luminous region) 7 of a third luminescent polymer formed on photo-bleached region 5 of the second luminescent polymer, a non-photo-bleached region (luminous region) 8 of the third luminescent polymer formed between a portion of photo-bleached region 5 of the second luminescent polymer a third metal electrode 9 second metal electrode 9" patterned on non-photo-bleached region 6 of the second luminescent polymer, and the third metal electrode 9 patterned on non-photo-bleached region 8 of the third luminescent polymer. In FIG. 1B, reference numeral 7' designates a polymer non-luminous region in which the first, second and third polymers photo-bleached are sequentially buried.

Figure 2A:
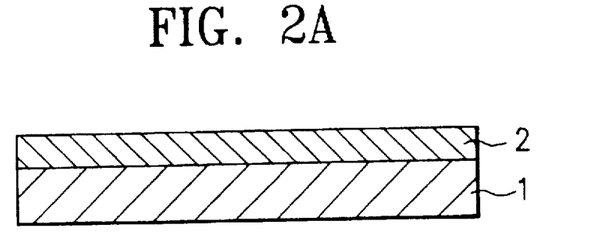
FIGS. 2A to 2N are cross-sectional views showing a process for fabricating the stacked structure of the color display device shown in FIGS. 1A and 1B.
Figure 2B:
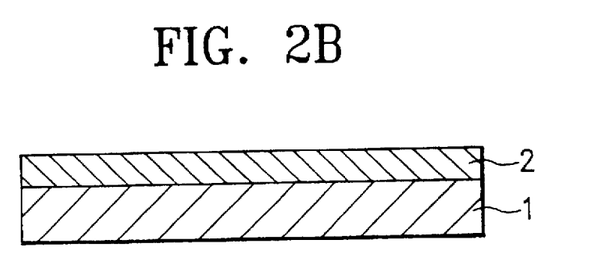
Figure 2C:
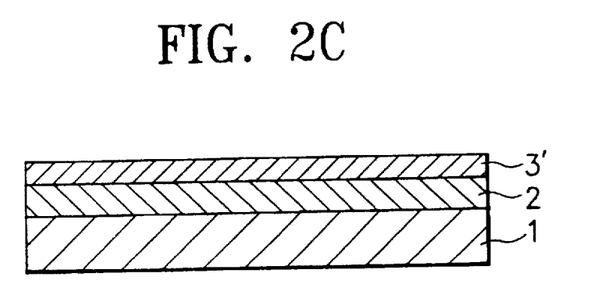
Figure 2D:
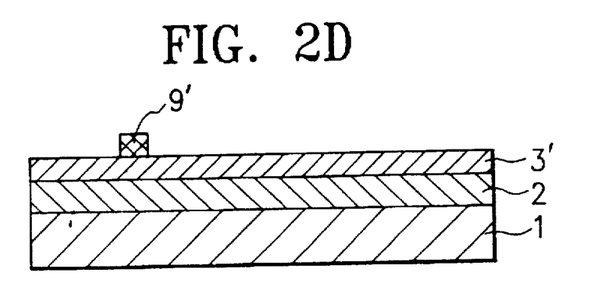
Figure 2E:
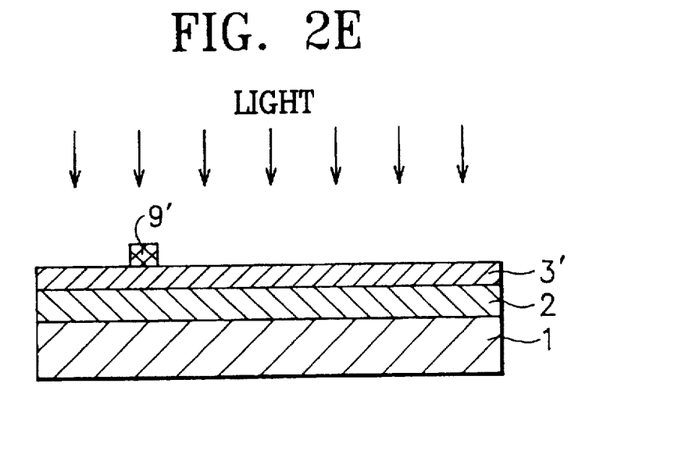
Figure 2F:
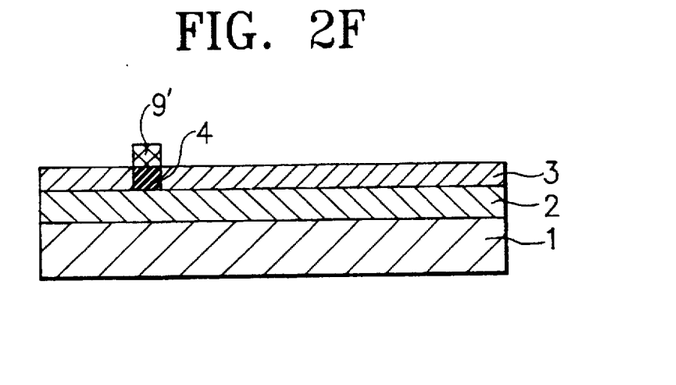
Figure 2G:
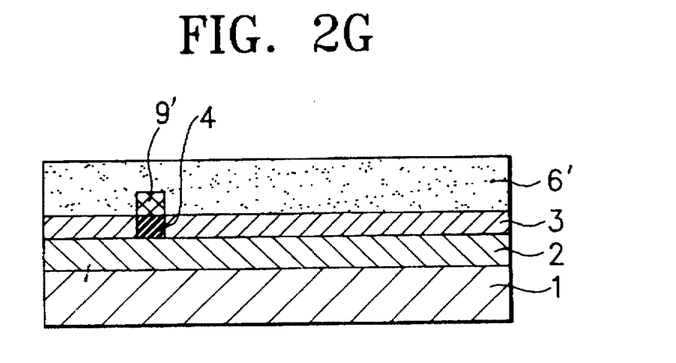
Figure 2H:
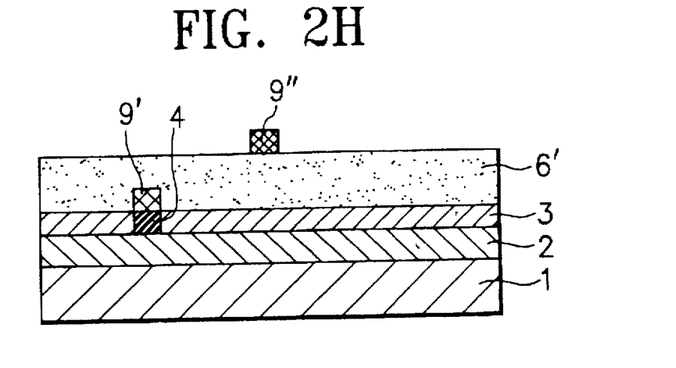
Figure 2I:
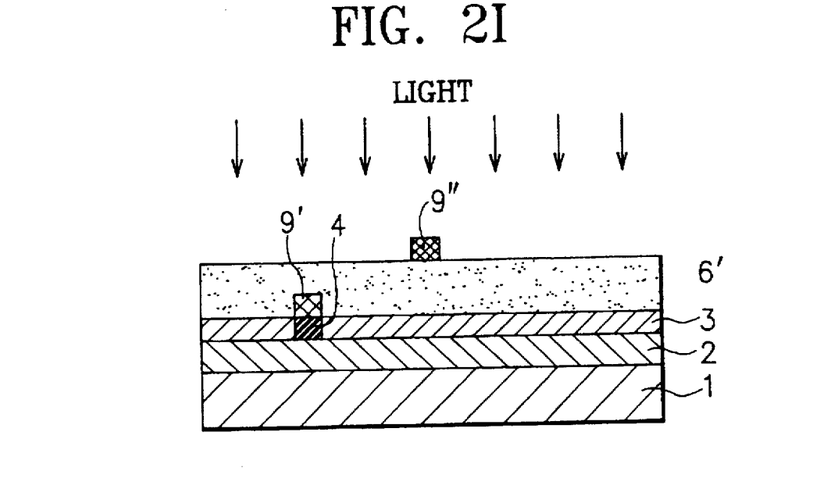
Figure 2J:
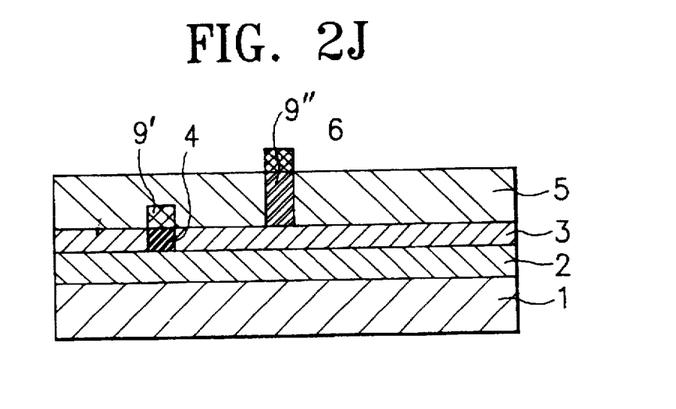
Figure 2K:
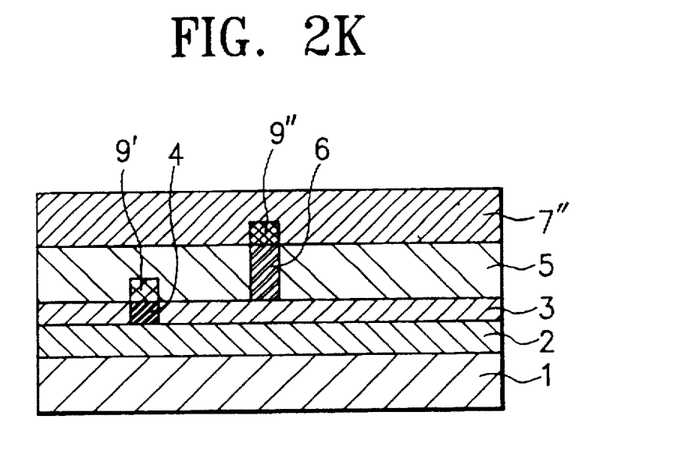
Figure 2L:
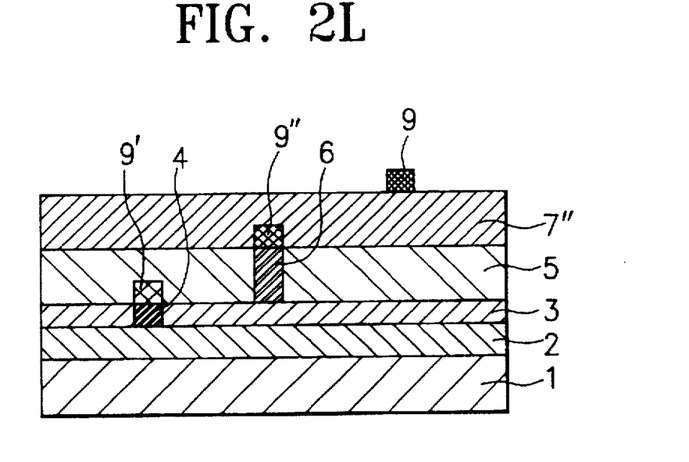
Figure 2M:
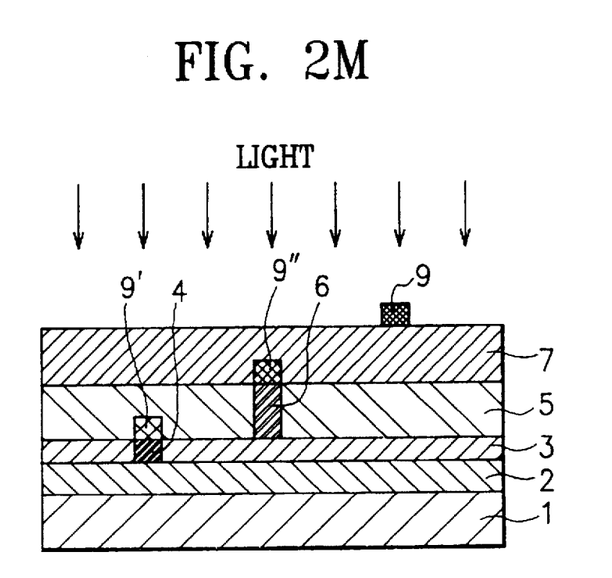
Figure 2N:
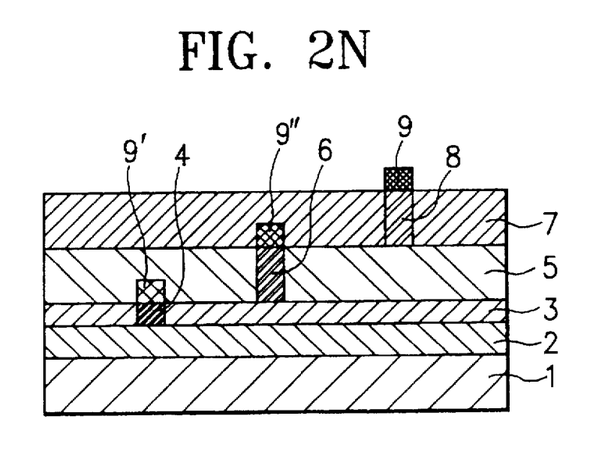

FIGS. 2A to 2N are cross-sectional views showing a process for fabricating the stacked structure of the color display device shown in FIGS. 1A and 1B. As shown in FIG. 2A, a transparent electrode material is deposited on transparent substrate 1 to form transparent electrode thin film. As shown in FIG. 2B, the transparent electrode thin film is patterned into a predetermined form through a predetermined process to form transparent electrode 2. As shown in FIG. 2C, a first luminescent polymer thin film 3' is formed on transparent electrode 2, and heat treatment is carried out to harden thin film 3'.

As shown in FIG. 2D, first metal electrode 9' is formed in the shape of a stripe on a portion of first luminescent polymer thin film 3', which is to be a luminous region. As shown in FIG. 2E, light is irradiated to the overall surface of the substrate using first metal electrode 9' as a mask, to photo-bleach a portion on which the metal electrode is not covered, thereby forming photo-bleached region (non-luminous region) 3 and non-photo-bleached region (luminous region) 4 of the first luminescent polymer as shown in FIG. 2F. Then, as shown in FIG. 2G, second luminescent polymer thin film 6' is formed on the overall surface of the substrate using a second polymer material. As shown in FIG. 2H, second metal electrode 9" is formed on a portion of second luminescent polymer thin film 6' in the shape of a predetermined pattern.

As shown in FIG. 2I, light is irradiated to the overall surface of the substrate using second metal electrode 9" as a mask, to photo-bleach a portion on which the metal electrode is not covered, thereby forming photo-bleached region (non-luminous region) 5 and non-photo-bleached region (luminous region) 6 of the second luminescent polymer as shown in FIG. 2J. Then, as shown in FIG. 2K, third luminescent polymer thin film 7" is formed on the overall surface of the substrate using a third polymer material. As shown in FIG. 2L, third metal electrode 9 is formed on a portion of third luminescent polymer thin film 7" in the shape of predetermined pattern.

As shown in FIG. 2M, light is irradiated to the overall surface of the substrate using third metal electrode 9 as a mask, to photo-bleach a portion on which the metal electrode is not covered, thereby forming photo-bleached region (non-luminous region) 7 and non-photo-bleached region (luminous region) 8 of the third luminescent polymer as shown in FIG. 2N. By doing so, the color display device of the present invention is accomplished. Here, transparent electrode 2 formed on transparent substrate 1 should be patterned into a form with an appropriate line width with regard to the pixel size of the color display device. Also, the first polymer thin film is spin coated on transparent substrate 1 on which patterned transparent electrode (anode) 2 is covered. Then, the first polymer thin film is selectively photo-bleached, leaving a predetermined portion required to be luminous. Thereafter, for electroluminescence of the first polymer thin film, an electrode material is deposited on a portion of the first polymer thin film, in which photo-bleaching is not carried out, to form an electrode for cathode. Second and third polymer thin films are formed through the same method as described above. By doing so, the color display device of the present invention can be realized as shown in FIG. 1.

The principles of the three primary color luminescence in the above-described color display device of the present invention will be explained below. The electroluminescence of the first polymer film on the substrate can be transmitted through the transparent electrode and substrate, similar to the electroluminescence of single layer. In case of the electroluminescence of the second polymer film, an electric field is simultaneously applied to the photo-bleached region of the first polymer film and non-photo-bleached region of the second polymer film. However, since the photo-bleached region of the first polymer film is not luminous, it is possible for the second polymer film to be luminous. Here, when luminous light passes through the transparent substrate, it passes the photo-bleached region of the first polymer film. This may absorb light. However, since the photo-bleached region hardly absorbs light compared to the non-photo-bleached region. The absorption in the photo-bleached region of the first pollymer layer can be ignored. Meanwhile, the case of the third polymer film is identical to the aforementioned second case.

Therefore, in the color display device according to the present invention, it is possible to control the intensity of the luminous light of each film of the stacked structure by adjustment of on/off of cathode voltage for each film and its level. As a result, it is possible to control the color for each individual pixel. As described above, the present invention can reduce the intensity of the electroluminescence in the photo-bleached region, and light absorption in the visible light region. Furthermore, according to the present invention, the color display device can be obtained, in which three layers having three primary colors are stacked, and the luminous and non-luminous regions of each layer are formed through photo-bleaching.

Figure 3:
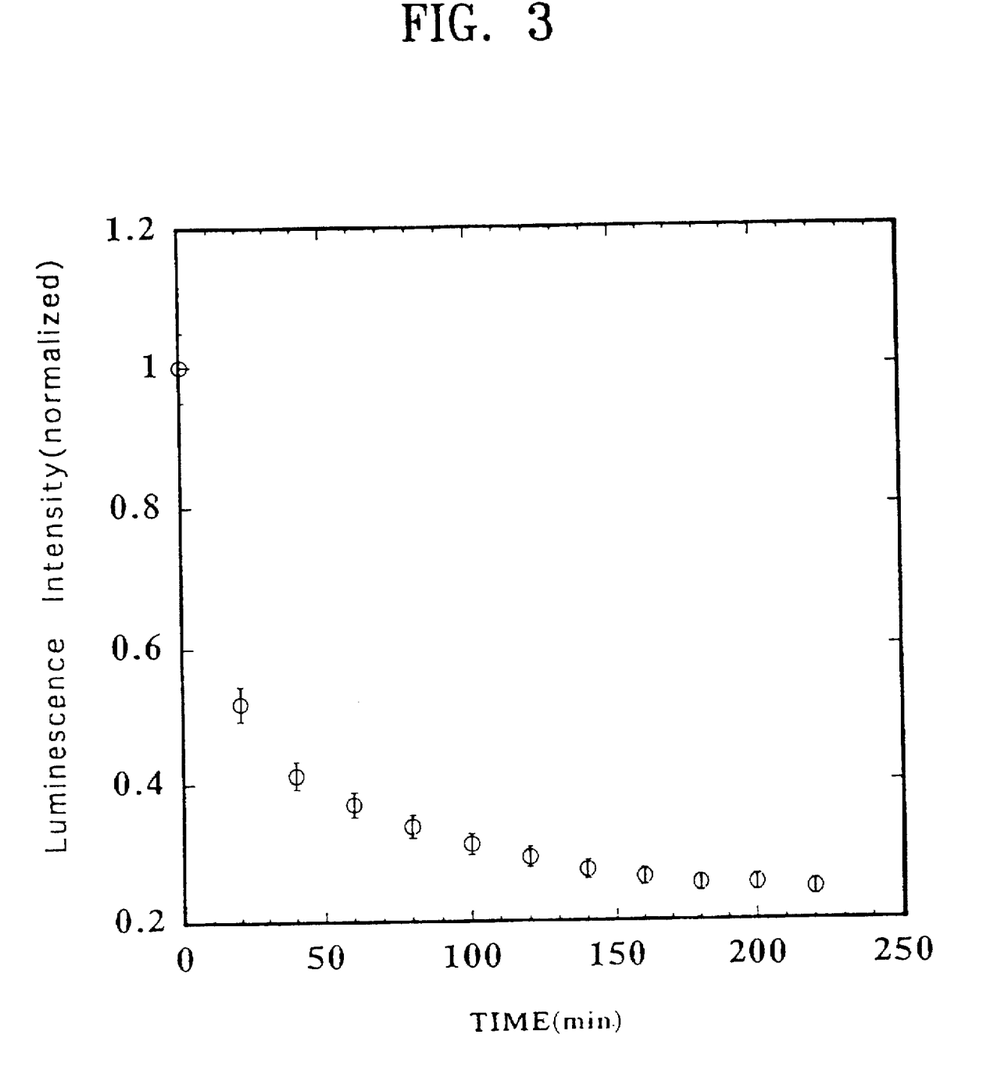
FIG. 3 is a graph showing the decay curve for photoluminescence during photo-bleaching.

FIG. 3 is a graph showing decay curve for photoluminescence during photo-bleaching. It shows that photoluminescence during photo-bleaching is rapidly decreased as light irradiation time increases. The electroluminescence occurs through the same mechanism as that of the photoluminescence. Accordingly, referring to FIG. 3, as photo-bleaching progresses, the intensity of the electroluminescence in the photo-bleached region is reduced, and ultimately, the electroluminescence does not occur.

The color display device of the present invention can be effectively applied for a multi-color display device, or color display pixel of fundamental element of the luminescent device. Accordingly, the color display device of the present invention can replace LCD or cathode-ray tube. Furthermore, the present invention can realize the wide wall-mounting display, resulting in faster information exchange.

Therefore, it should be understood that the present invention is not limited to the particular embodiment disclosed herein as the best mode contemplated for carrying out the present invention, but rather that the present invention is not limited to the specific embodiments described in this specification except as defined in the appended claims.

What is claimed is:

1. A color display device using an electroluminescent polymer, comprising:

a transparent substrate;

a transparent electrode formed on said transparent substrate, said electrode being buried by a luminescent polymer;

a non-luminous region formed by photo-bleaching a first luminescent polymer formed on said transparent electrode;

a first metal electrode formed on said non-photo-bleached region of said first luminescent polymer;

a luminous region formed in a non-photo-bleached region of a first luminescent polymer formed between a portion of said transparent electrode and a first metal electrode;

a non-luminous region formed by photo-bleaching a second luminescent polymer formed on said photo-bleached region of said first luminescent polymer;

a luminous region formed in a non-photo-bleached region of a second luminescent polymer formed between a portion of said photo-bleached region of said first luminescent polymer and a second metal electrode;

a non-luminous region formed by photo-bleaching a third luminescent polymer formed on said photo-bleached region of said second luminescent polymer; and a luminous region formed in a non-photo-bleached region of a third luminescent polymer formed between a portion of said photo-bleached region of said second luminescent polymer and a third metal electrode;

wherein said second metal electrode is formed on said non-photo-bleached region of said second luminescent polymer, and said third metal electrode is formed on said non-photo-bleached region of said third luminescent polymer.

2. The device as claimed in claim 1, wherein said respective luminous and non-luminous regions of said first, second and third luminescent polymers are formed through photo-bleaching.

3. A method for fabricating a color display device using an electroluminescent polymer, said method comprising the steps of:

depositing a transparent electrode material on a transparent substrate;

patterning said material to form a transparent electrode;

forming a first luminescent polymer thin film on said transparent electrode, and carrying out heat treatment to harden said thin film;

forming a first metal electrode on a portion of said first luminescent polymer thin film, beneath which a luminous region will be formed, said electrode being formed in the shape of a stripe;

irradiating light to the overall surface of said substrate to selectively photo-bleach a portion on which said first metal electrode is not covered using said first metal electrode as a mask, thereby forming a non-luminous photo-bleached region and a luminous non-photo-bleached region of said first luminescent polymer thin film;

forming a second luminescent polymer thin film on said first luminescent polymer thin film, forming a second metal electrode on a portion of said second luminescent polymer thin film, beneath which a luminous region will be formed, and irradiating light to the overall surface of said substrate to selectively photo-bleach a portion on which said second metal electrode is not covered using said second metal electrode as a mask, thereby forming a non-luminous photo-bleached region and a luminous non-photo-bleached region of said second luminescent polymer thin film, said second electrode being formed in the shape of a stripe; and forming a third luminescent polymer thin film on said second luminescent polymer thin film, forming a third metal electrode on a portion of said third luminescent polymer thin film, beneath which a luminous region will be formed, and irradiating light to the overall surface of said substrate to selectively photo-bleach a portion on which said third metal electrode is not covered using said third metal electrode as a mask, thereby forming a non-luminous photo-bleached region and a luminous non-photo-bleached region of said third luminescent polymer thin film, said third electrode being formed in the shape of a stripe.

4. The method as claimed in claim 3, wherein said photo-bleaching reduces the intensity of electroluminescence in said photo-bleached region, and decreases light absorption in a visible light region.

* * * * *

UNITED STATES PATENT AND TRADEMARK OFFICE
Certificate

Patent No. 5,792,561                                                         Patented: August 11, 1998

On petition requesting issuance of a certificate for correction of inventorship pursuant to 35 U.S.C. 256, it has been found that the above identified patent, through error and without any deceptive intent, improperly sets forth the inventorship.

Accordingly, it is hereby certified that the correct inventorship of this patent is: Tae-Hyoung Zyung; Wol-Yon Whang; Jang-Joo Kim, all of Daejon, Rep. Of Korea.

Signed and Sealed this Nineteenth Day of September, 2000.

*JAMES J. SEIDLECK*
*Supervisory Patent Examiner*
Art Unit 1711